US006574141B2

(12) United States Patent  
Baltar

(10) Patent No.: US 6,574,141 B2
(45) Date of Patent: Jun. 3, 2003

(54) DIFFERENTIAL REDUNDANCY MULTIPLEXOR FOR FLASH MEMORY DEVICES

(75) Inventor: Robert L. Baltar, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/982,246

(22) Filed: Oct. 16, 2001

(65) Prior Publication Data

US 2002/0085415 A1 Jul. 4, 2002

Related U.S. Application Data

(63) Continuation-in-part of application No. 09/752,345, filed on Dec. 29, 2000.

(51) Int. Cl.[7] ................................................ G11C 16/06
(52) U.S. Cl. .............................. 365/185.09; 365/185.2; 365/185.21; 365/207
(58) Field of Search ....................... 365/185.09, 185.21, 365/185.2, 185.07, 185.24, 200, 205, 207, 185.33

(56) References Cited

U.S. PATENT DOCUMENTS

| 4,119,995 | A | 10/1978 | Simko |
| 5,341,332 | A | 8/1994 | Inoue et al. |
| 5,487,033 | A | 1/1996 | Keeney et al. |
| 5,867,430 | A | 2/1999 | Chen et al. |
| 6,005,799 | A | 12/1999 | Rao |
| 6,141,237 | A | 10/2000 | Eliason et al. |

OTHER PUBLICATIONS

Pasternak and Salama, "Differential Pass–Transistor Logic," Circuits & Devices, Jul. 1993, 8 pages, vol. 9, No. 4, USA.

Primary Examiner—Richard Elms
Assistant Examiner—Hien Nguyen
(74) Attorney, Agent, or Firm—Peter Lam

(57) ABSTRACT

An apparatus for a differential redundancy multiplexor for flash memory devices. One embodiment comprises a memory array comprising a main memory element and a redundant element. A sense amp is coupled to the memory array to evaluate the main memory element and to generate a first pair of differential output signals. A redundant sense amp is coupled to the memory array. The redundant sense amp is to evaluate the redundant memory element and to generate a second pair of differential output signals. A multiplexor is coupled to the sense amp and the redundant sense amp. The multiplexor is to receive the first pair and the second pair. The multiplexor is to generate a single ended output from evaluating a single pair of differential output signals. Control logic coupled to the multiplexor to control whether the first pair or the second pair is the single pair of differential output signals evaluated.

28 Claims, 6 Drawing Sheets

DIFFERENTIAL REDUNDANCY MULTIPLEXOR FOR FLASH MEMORY DEVICES

REFERENCE TO RELATED APPLICATION

This application is a continuation in part of U.S. patent application Ser. No. 09/752,345, filed Dec. 29, 2000.

FIELD OF THE INVENTION

The present invention relates generally to the field of computers and computer systems. More particularly, the present invention relates to a differential redundancy multiplexor for flash memory devices.

BACKGROUND OF THE INVENTION

One type of non-volatile electrically erasable and electrically programmable read-only semiconductor memory is commonly referred to as a flash memory. Once programmed, the flash memory retains the program data until the memory is erased. In a typical flash memory structure, several blocks of flash memory are configured together on a flash memory device. A variety of flash memory devices are known in the art, but generally, a flash cell is comprised of a metal oxide semiconductor (MOS) transistor that includes an isolated or floating gate that is programmed typically by electron injection from the channel.

In one typical configuration, a flash cell is programmed by applying a high voltage (such as 12 volts) on the control gate, 0 volts on the source and an intermediate voltage such as 6 volts on the drain. A channel-hot-electron injection causes the isolated or floating gate to be negatively charged. The charged floating gate causes the threshold voltage ($V_t$) of the device to increase. Thus, a programmed cell requires a higher threshold voltage to turn the transistor on as compared to an erased cell. In a read operation, generally, the source is grounded and a read voltage, such as 5 volts, is applied to the control gate and the output is determined at the drain. The amount of the read current at the drain determines if the device is programmed or not programmed. In order to erase the programmed cell, the drain is made to float while a voltage is impressed across the source and the control gate, such as 12 volts on the source with a grounded control gate or 5 volts on a source with a negative voltage on the control gate. When the cell is being erased, charges are removed from the floating gate to the source terminal so that the threshold voltage of the device is reduced.

In flash memories, sensing amplifiers (also referred to as sense amps) are utilized to read the content of the flash memory arrays. These sensing amplifiers generally provide single-ended outputs onto an output bus. A common problem with single-ended outputs is that the output typically swings from ground to a rail voltage, such as Vcc. When additional memory cells are introduced, which outputs are impressed on the output line, the loading increases the capacitance coupled to the output lines. This loading, along with the significant voltage swings impacts the performance of the memory. Thus, performance, such as the speed in reading an output from a flash cell and the circuit power requirements, can degrade as more load is placed on the output.

What is needed is a technique for addressing this performance factor in flash memories.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method and apparatus for a differential redundancy multiplexor for flash memory devices is disclosed. The embodiments described herein are described in the context of a memory, but are not so limited. Although the following embodiments are described with reference to flash memory, other embodiments are applicable to other integrated circuits or logic devices. The same techniques and teachings of the present invention can easily be applied to other types of circuits or semiconductor devices that use sensing amplifiers and differential signals.

In the following description, for purposes of explanation, numerous specific details are set forth in order to provide a thorough understanding of the present invention. One of ordinary skill in the art, however, will appreciate that these specific details are not necessary in order to practice the present invention. In other instances, well known electrical structures and circuits have not been set forth in particular detail in order to not necessarily obscure the present invention.

Embodiments of the present invention relate to a differential redundancy multiplexor for flash memory devices. Multiplexors often use transmission gate logic for controlling the passing of data from main and redundant sense amps. The differential redundancy multiplexor embodiments described below use pass gate logic to implement multiplexing the redundant sense amp data with non-redundant sense amp outputs. The use of pass gates is facilitated by the implementation of the differential output bus in the sense amps. Alternative embodiments of a differential redundancy multiplexor use transmission gates to implement multiplexing of signals.

In one existing flash architecture, each redundant sense amp has to drive sixteen multiplexors in order to repair bad columns in the flash array. In the standard implementation of the burst architecture, each redundant sense amp has to drive 64 loads. The use of Complementary Metal Oxide Semiconductor (CMOS) gates to implement these present circuits has caused the buffer that drives the multiplexor to be large. This large buffer size results in the need for additional gates to be added in the speed critical output path to limit the load on the sense amp. The resultant circuit degrades read performance and impacts the die size negatively.

In one embodiment of the present invention, the implementation of the multiplexor with pass gates in the differential output path takes advantage of the capability of the differential output path to efficiently drive large capacitances. Since the differential output path does not need to drive to the power supply rail, N-type pass gates can be used instead of CMOS logic or transmissions gates, thus reducing the capacitance that has to be charged and the area required for the layout of the circuits.

Figure 1:
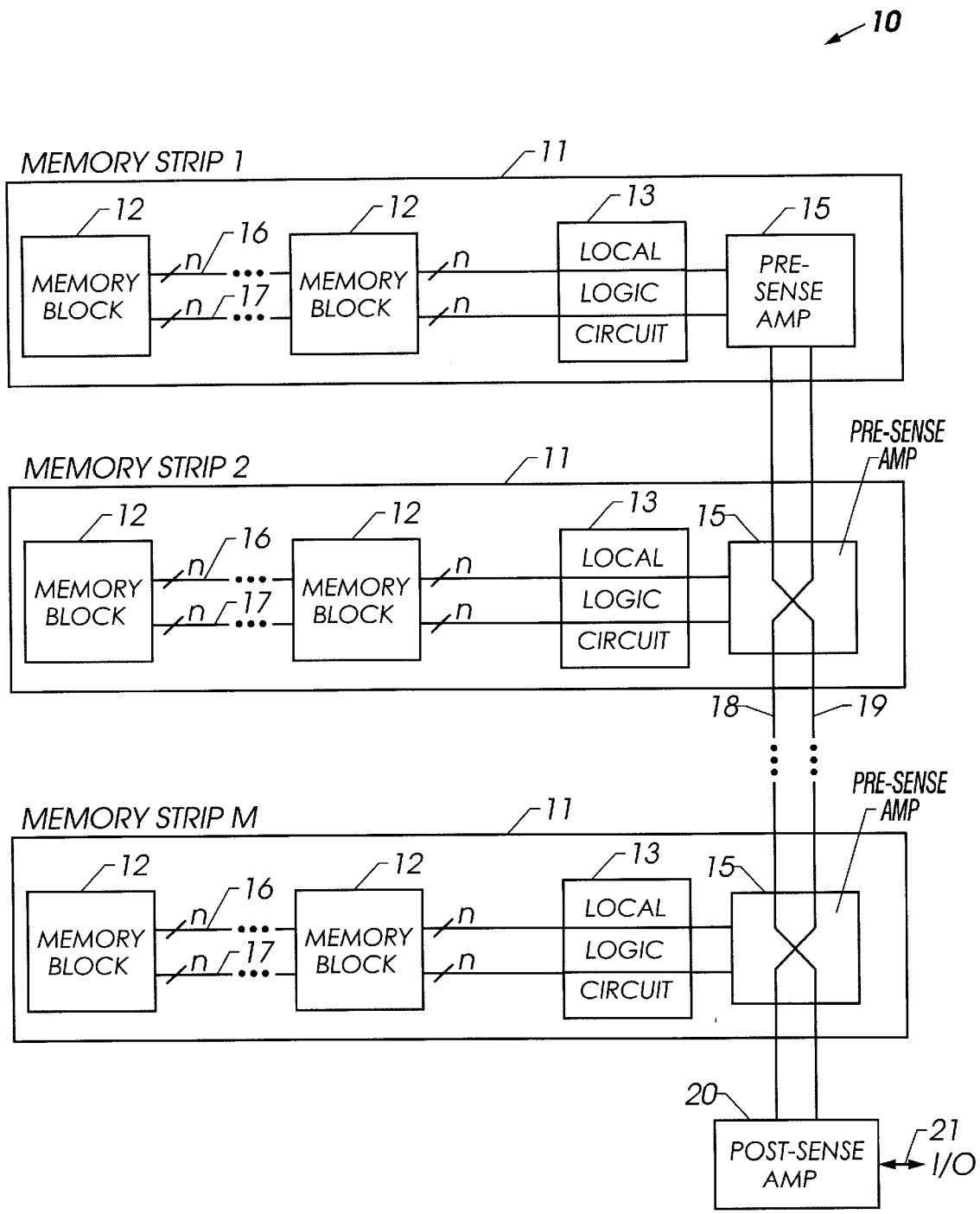
FIG. 1 is a block schematic diagram showing a flash memory device implementing the present invention in which differential sensing outputs are obtained from multiple memory strips containing flash memory.

Referring to FIG. 1, one implementation of the present invention is shown in which the particular example involves a flash memory device 10. The flash memory is a non-volatile electrically erasable and electrically programmable read-only semiconductor memory. The example memory device 10 is comprised of a number of memory strips 11, wherein each memory strip 11 includes one or more flash memory block(s) 12. Generally, each memory block 12 is configured as an array or arrays and functions equivalently to various flash memory devices currently known in the art. The memory blocks 12 can be programmed, read and block erased according to practices known in the art pertaining to flash memory devices. In one particular embodiment, two blocks 12 are present on each strip 11 and are commonly referred to as an odd block and an even block. Each strip 11 also has a local logic circuit 13 that includes various circuitry required to access, program, read and erase memory cells of the memory block(s) 12 on each strip. A variety of circuits can be implemented to provide these functions, including those circuits known in the art.

Also present on each memory strip 11 is a pre-sensing amplifier (pre-sense amp) 15 that includes circuitry for practicing the present invention. A pair of data lines 16 and 17 are also shown coupling outputs of the memory blocks 12 to the sense amplifier 15. In typical flash configurations, data line 16 is typically comprised of a plurality of lines "n" and the lines are referred to as bit lines which emanate as column lines from an array of main memory cells, while lines 17 (line 17 is also comprised of multiple lines) are from reference cells of the flash memory array. The general configuration is not critical to the understanding of the present invention other than that two read lines pertaining to a given memory cell array are coupled to the pre-sense amplifier 15 to determine if the particular flash memory cell being read is either in a programmed state or an erased state.

In the flash memory device 10 shown in FIG. 1, the outputs of the pre-sense amplifier 15 are coupled on a pair of differential signal lines (also referred to as bus, bus lines, or sense output) 18 and 19 to a post-sensing amplifier (post-sense amp) 20. It is appreciated that the memory device 10 may have only one memory strip 11 or it may have a plurality of memory strips 11, in which the outputs from each pre-sensing amplifier 15 are coupled to the post-sensing amplifier 20 on the bus lines 18 and 19. For example, in one embodiment, each of the memory strips includes eight megabits (8 M) of flash memory, such that the number of strips will determine the total memory included within the flash memory device 10. For example, if four strips are present, then 32 M of memory would be available in device 10. Similarly if eight such strips 11 are present in device 10, then 64 M of memory would be available.

Also, it is to be noted that each strip will have a number of pre-sense amps 15, which number depends on the number of data lines being read. For example, if the memory block is a 64 bit array (that is n=64), then there will be at least 64 pre-sense amps 15 on that strip 11. The number of differential output line pairs 18, 19 vary depending on the particular embodiment and architecture. Thus the number of differential output line pairs 18, 19 may not correspond to the number of data line pairs 16, 17. Data line pairs 16, 17 are global bitlines in this example. But the number of post-sense amps 20 should correspond to the number of line pairs 18, 19.

As will be described below, each pre-sense amp 15 receives the output of the memory block as a differential input and provides a differential output on the bus pairs 18 and 19. Each post-sensing amplifier 20 receives differential inputs from the line pairs 18 and 19 and generally generates a single-ended output on bus 21. The data lines 21 of the different post-sense amps 20 can be driven to a multiplexor, which in turn can be enabled to select the desired bits to be outputted from the device 10. For example, a memory device may have 64 bits of data read simultaneously on 64 post-sense amps 20, but output multiplexors coupled to these 64 data signals can be controlled to drive out 8 or 16 of the 64 data bits. In many applications, the output from the memory device 10 are coupled to various other devices, including a processor that utilizes the data output from the memory device 10.

Figure 2:
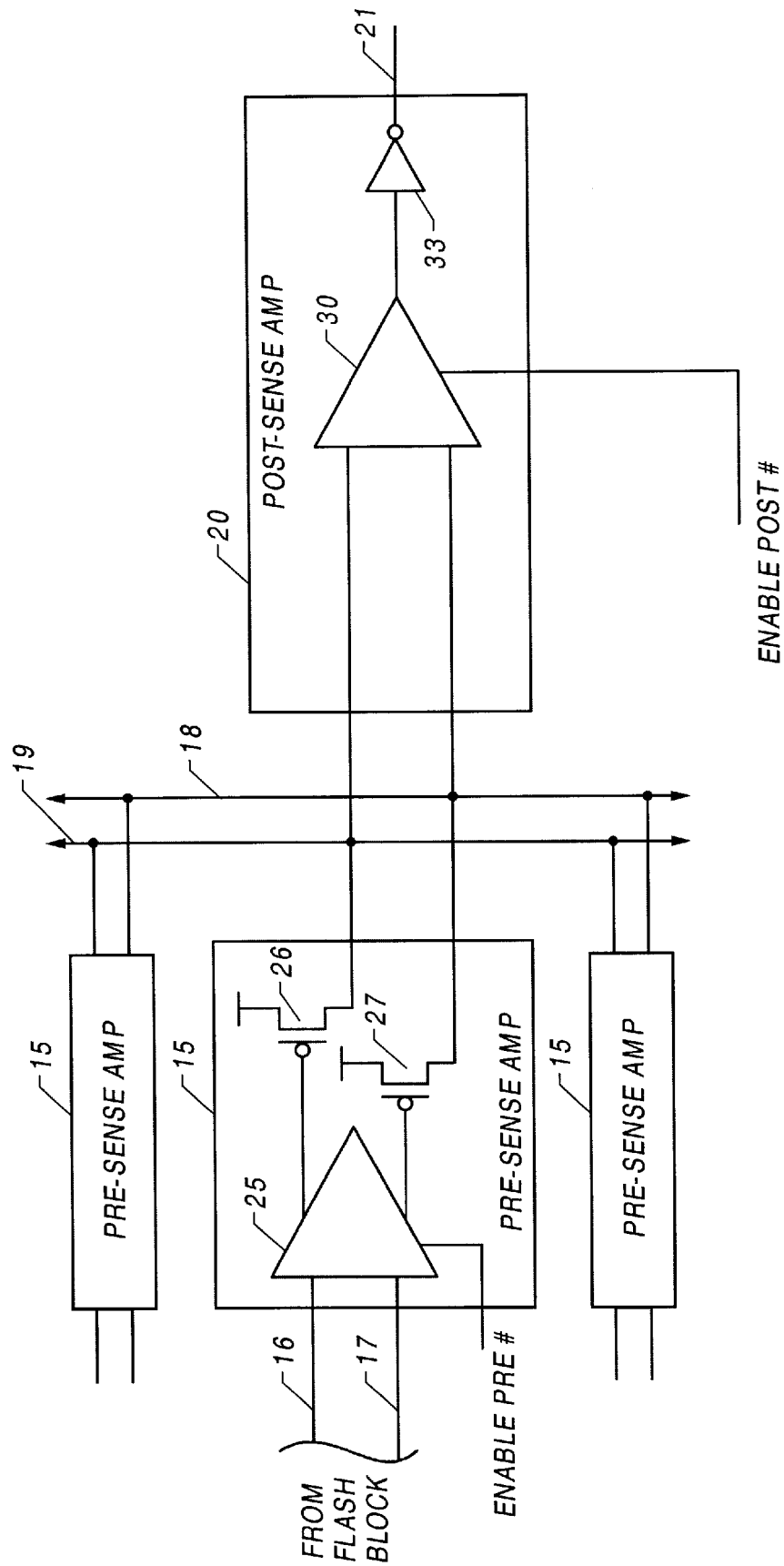
FIG. 2 illustrates one embodiment of the present invention in which a differential pre-sensing amplifier is used to drive differential output lines to a differential post-sensing amplifier.

Also referring to FIG. 2, the circuitry utilized in the pre-sensing amplifier and the post-sensing amplifier 20 are shown. Each pre-sensing amplifier 15 includes a differential amplifier 25 coupled to receive the outputs from the memory array as differential inputs when a given memory block 12 is sensed. The sensing of the memory array is essentially a read operation in which the content of the addressed memory cells are read. Flash memories generally are read to determine if the particular memory cell is programmed or erased. In one embodiment, the input to a given differential amplifier 25 is obtained by having an output from a memory cell being read on one of the input line (for example, line 16) while an output from a reference cell (having a known reference value) is read on the other corresponding line (for example, line 17).

The amplifier 25 outputs a differential signal on to the line pair 18, 19 through transistors 26, 27. In the particular example, the outputs of the differential amplifier 25 are coupled to the gates of transistors 26, 27, which in this example are P-type devices. Transistors 26, 27 operate as pull-up transistors to drive the differential read signal from the memory cells onto the output lines 18, 19. As noted in FIG. 2, each of the pre-sense amps 15 has the output coupled onto line pairs 18, 19 through a pair of P-type transistors when the pre-sense amp 15 is activated by an enable signal, ENABLE PRE#.

Each post-sensing amplifier 20 includes an amplifier 30 which has its inputs coupled to the line pairs 18, 19. The output of the amplifier 30 is coupled through a driver 33 to provide an output on line 21. It is appreciated that the output of the amplifier 30 could be made a differential output, but is shown as a single-ended output so that the flash device 10 could readily be substituted for a variety of single ended flash memory devices currently in use.

Although the terminology refers to pre-sense amps and post-sense amps, these circuit blocks can also be described with other labels. A pre-sense amp as described here may also be referred to as a sense amp. Similarly, a post-sense amp is also referred to as a multiplexor. For the embodiments below, the post-sense amp is a differential multiplexor. However, the functionality of the blocks remains the same.

Each pre-sense amp 15 drives its differential output signals 18, 19, out to a post-sense amp 20. However, the routing lines between the pre-sense amp 15 and the post-sense amp 20 can include a large amount of loading and capacitance such as from diffusion capacitance, metal routing, etc. In existing circuits using sense amps with single-ended outputs, large sized buffers were necessary in the signal path to assist in boosting and driving the signals. These buffers add cost in terms of die size and power consumption. With the advent of differential signals in the sense amps, these buffers can be drastically reduced in size or removed. Another advantage with the use of differential signaling in the sense amps is that pass gate logic can be implemented. Existing sense amps often drive its signals from rail to rail at CMOS voltages, thus requiring the use of transmission gates. But with differential signals, the voltage swing in the signals can be smaller and pass gates are sufficient in transferring the data signals.

Figure 3A:
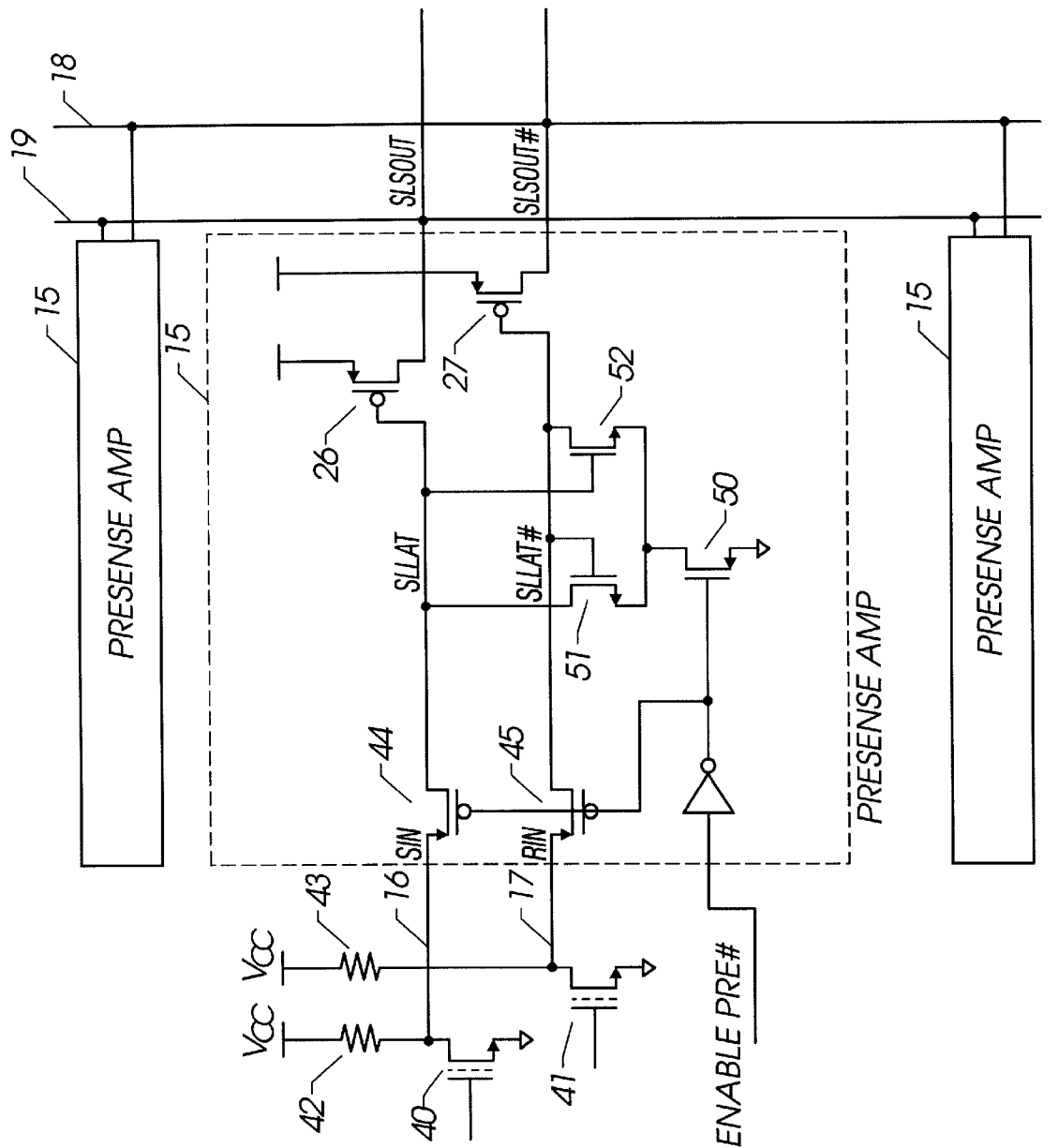
FIG. 3A illustrates an expanded circuit diagram for the pre-sense amp of FIG. 2.
Figure 3B:
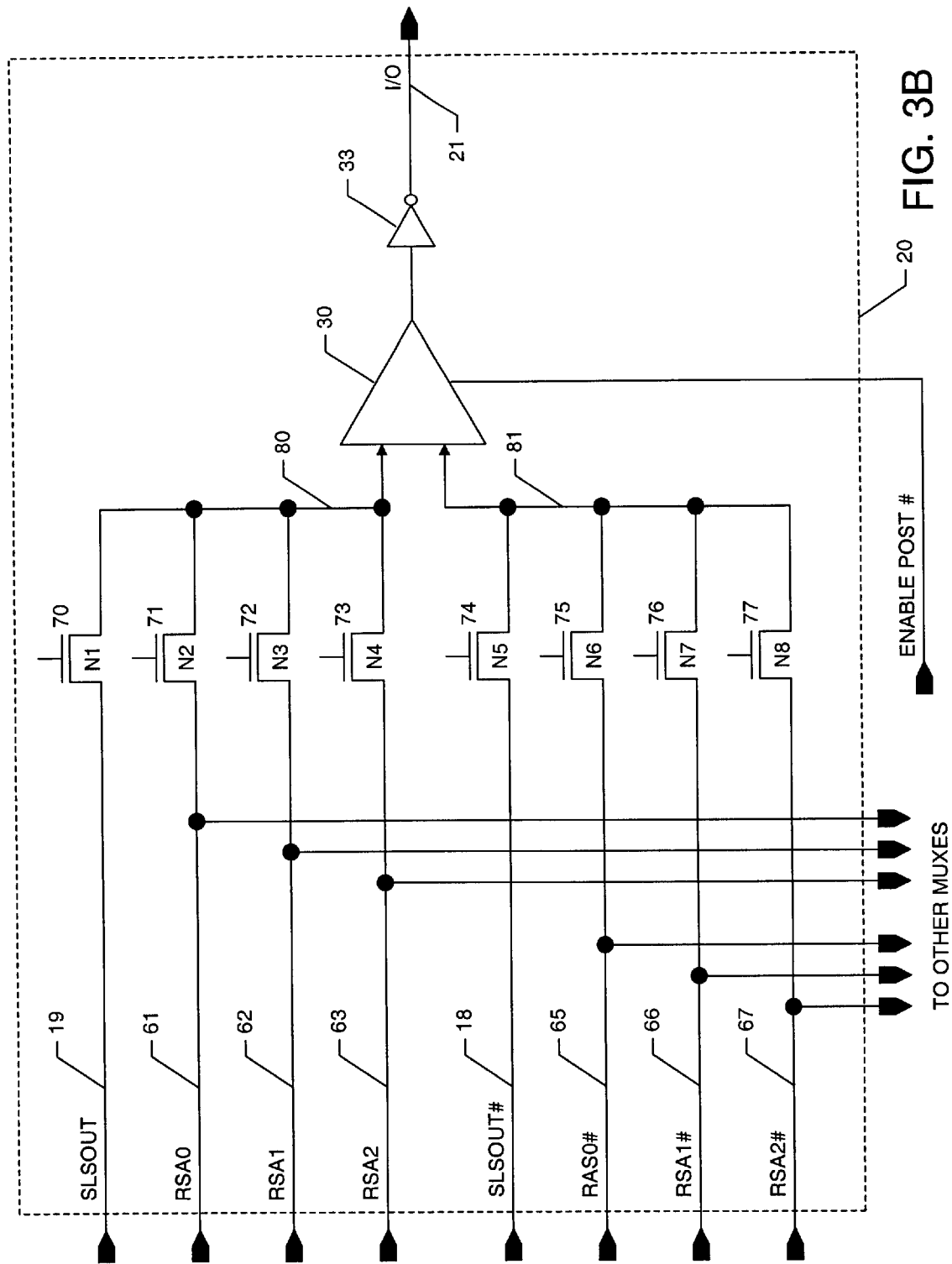
FIG. 3B illustrates an expanded circuit diagram for the post-sense amp of FIG. 2.
Figure 4:
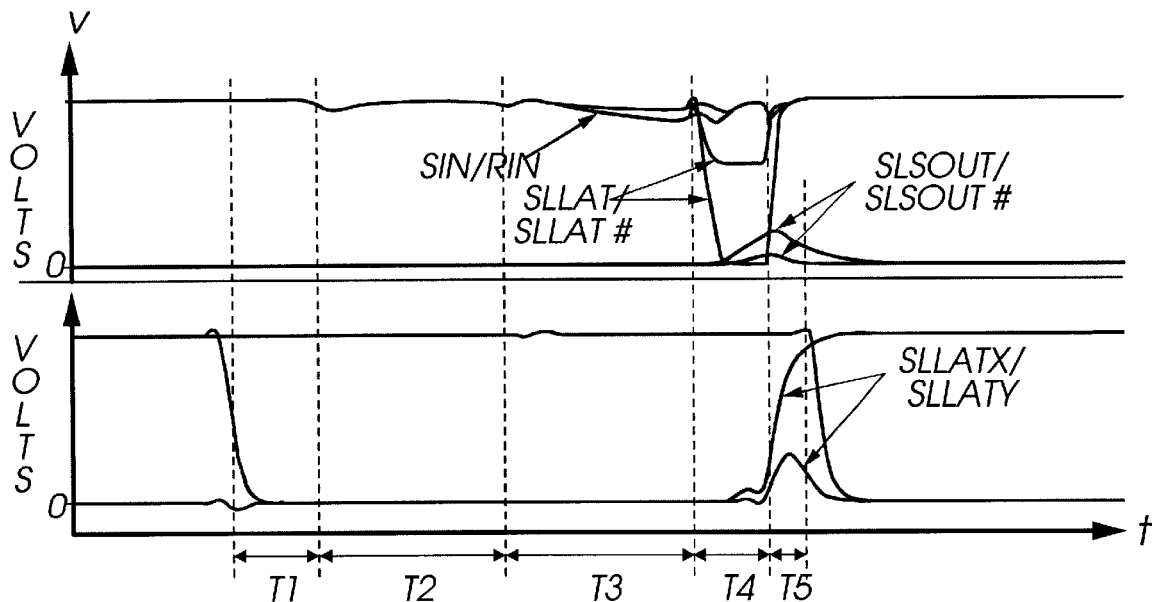
FIG. 4 is a timing diagram showing the timing of the various signal nodes illustrated in FIG. 3A.

As shown in FIG. 2, the enable signal ENABLE PRE# is used to enable the differential amplifier 25 in the pre-sense amp 15. Equivalently, an enable signal, ENABLE POST#, is used to enable amplifier 30 in the post-sense amp 20. The two enable signals, which are described in more detail below, are used to enable each of the sense amps 15, 20 respectively, so that these amplifiers 15, 20 operate as a latch in latching the memory output onto the line pairs 18, 19 and then to the output line 21. It is also appreciated that the "#" sign is utilized herein to denote either a compliment condition (such as activation on low signal condition) and/or the complimentary line of the differential pair. Also referring to FIGS. 3A, 3B, and 4, FIGS. 3A and 3B show a more detailed circuit diagram for the pre-sense amplifier 15 and the post-sense amplifier 20, respectively. FIG. 4 shows waveform diagrams pertaining to signals on nodes associated with the sense amplifiers 15, 20.

The embodiment shown in FIG. 3A is better understood when referenced with the timing diagram of the various signals (shown in FIG. 4). A particular flash memory cell which is to be read for its content is shown as transistor 40. Transistor 40 is a typical flash memory cell having a floating gate, control gate, drain and source. Transistor 41 depicts a reference cell for setting a reference level for reading transistor 40. The drains of both of the transistors (also referred to herein as cells) 40, 41 are coupled to respective differential inputs of the amplifier 25 in the pre-sense amp 15. In the timing diagram, a read access commences at time T1.

In the particular embodiment shown, during time T1, the differential output lines 18, 19 are discharged, in which SLSOUT and SLSOUT# signal nodes are grounded. Both of the sense amplifiers 15, 20 are disabled. During time T2, the differential input lines 16, 17 noted by signal SIN (sense in) and its differential counterpart RIN (reference in) are precharged to Vcc through resistors 42, 43 each respectively coupled to the drains of the memory cells 40, 41. The SIN and RIN signals are respectively coupled through P-type transistors 44, 45 to provide SLLAT and SLLAT# signals, which are respectively coupled to the gates of the P-type transistors 26, 27, which outputs are then coupled to the line pairs 18, 19. The signal onto line pairs 18, 19 are denoted as SLSOUT and SLSOUT#, respectively.

The enabling and disabling of each of the sense amplifiers 15, 20 are controlled by the ENABLE PRE# and ENABLE POST#. The ENABLE PRE# signal activates N-type transistor 50 which allows N-type transistors 51 and 52 to conduct. Thus, as shown in FIG. 4, through time T2, the signal nodes for SIN, RIN, SLLAT and SLLAT# are precharged to a Vcc level, while signal nodes for SLSOUT and SLSOUT# are at or near zero.

At some point after the commencement of the read sequence during time T3, a differential voltage develops between the SIN and RIN signals. A difference voltage (or margin) is noted due to the conduction of transistors 40 and 41 during T3 when the control gates of these respective transistors turn on the transistors 40 and 41. The difference in the threshold voltages of the transistors 40, 41 causes the transistors to have different voltages at the SIN/RIN differential inputs to the pre-sense amplifier 15. This difference in the voltage is exemplified in the SIN/RIN signals at time T3. Since the SIN/RIN inputs are shorted through the transistors 44, 45 to the SLLAT/SLLAT# nodes respectively, when the ENABLE PRE# goes low at the end of time T3, the SLLAT and the SLLAT# nodes are disconnected from the SIN/RIN inputs and the sense amplifier 15 amplifies the difference between the SLLAT and SLLAT# differential nodes.

At the same time that the pre-sensing amplifier 15 is enabled by ENABLE PRE#, the output lines 18, 19 are removed from a grounded state to a tri-state condition. Although not shown, generally a device grounds lines 18, 19 to maintain the lines 18 and 19 at a disabled or zero volt condition until the end of period T2. Once the lines 18, 19 are tri-stated, they are now available to respond to the differential signal from the activated pre-sense amp 15. The voltages on SLLAT/SLLAT# turn on the P-device output drivers 26, 27 to provide a differential output on lines 18, 19. Generally one of the P-devices 26 or 27 will be barely on while the other will have full VCC potential across its gate. This difference in drive causes a different ramp rate on SLSOUT and SLSOUT#, allowing a differential voltage to develop across and latch onto these nodes, as shown in time T4. The differential signal is sensed and latched during time period T5 by the post-sense amp 20 when ENABLE POST# is driven to ground. The output of the post-sense amp 20 is illustrated by the signal I/O 21.

As is described above, during time T4 when the pre-sense amp 15 is activated, the difference in voltage sensed by the differential inputs SIN and RIN are amplified as noted by signals SLLAT and SLLAT#. The bus lines 18, 19 coupling the output of all of the sense amplifiers 15 will respond by noting the difference of the differential voltage SLLAT and SLLAT#. However, since the SLSOUT signal is referenced to its compliment and sensed differentially, the differential lines 18, 19 need only transition a smaller voltage before it is sensed by the post sensing amplifier 20. This is exemplified by the difference in the amplitude of the SLSOUT and SLSOUT# signal during time T4.

Generally, a difference in the range of 50–200 millivolts between SLSOUT and SLSOUT# is adequate for providing the sensing output. The sensing could be available at a lower limit such as at 20 millivolts, but care must be taken that at the time of sensing the signal, an adequately measurable amplitude difference is present to ensure that a valid read is obtained from the memory cell. Furthermore, the sensing can be obtained at a higher voltage beyond 200 millivolts, but it could detract from the performance of the device if longer time is required to sense the voltage. Accordingly, a range of 50–200 millivolts provides adequate differential voltage to obtain proper reading of the memory cell, but with a minimal time period once the signals difference is noted. Thus the differential outputs SLSOUT and SLSOUT# of this embodiment transition within a small range and do not vary from CMOS rail to rail values.

As noted, since the power required to charge the output node of the pre-sense amp 15 is proportional to the magnitude of the transition voltage that it transitions and the capacitance of the node, limiting the voltage swing on lines 18, 19 reduces the amount of power required to put an output onto lines 18 and 19.

In the example illustrated, the memory cells provide a 64 bit output such that there will be 64 such pre-sensing amplifiers 15 for each of the memory strips 11. Accordingly, when small transitions are encountered with the differential sense amp of the present invention, smaller power requirements per line will make a significant difference in the total power when 64 lines are involved. In the particular example of a 64 bit data bus, the differential output onto bus lines 18, 19 can provide approximately 2 milliamp of read power savings which in some instances may be 10 percent of the total read power required for the device.

Furthermore, the limited voltage swing of the differential bus 18, 19 can also provide a performance benefit in the area of speed performance. Since the signal is referenced to its differential compliment it can be timed to be sensed when it has transitioned approximately 50–200 millivolts. This is in contrast to a digital signal which typically transitions at one half of the power supply voltage (or rail voltage) on average in order to sense valid data from a memory cell. The reduced transition time for sensing the memory cell provides considerable improvement in the performance of the memory device 10.

Furthermore, since the sense amplifiers are placed on each individual strip 11, only one overall post-sensing amplifier 20 per line is required for all of the memory strips 11. Since the output driver of the pre-sensing amplifier 15 is a single P-device for each line (shown by transistors 26 and 27) the circuitry is considerably smaller than the alternative implementation known in the prior art, which typically uses a tri-state inverter that is adequately large to drive several pico-Farads of load. In the present case, the P-type transistors 26 and 27 are of smaller capacitance and provide a much smaller load on each of the sense amplifiers 15.

FIG. 3B illustrates an expanded circuit diagram for the post-sense amp 20 of FIG. 2. Post-sense amp 20 provides a single-ended output based upon a pair of differential input signals. The post-sense amp 20 of this embodiment also functions as a multiplexor as one of four pairs of differential signals selected to be sensed and evaluated. The post-sense amp 20 of this embodiment also performs the redundant multiplexing.

Post-sense amp 20 includes an amplifier 30 and a buffer 33. The amplifier 30 is also commonly referred to as a comparator. Amplifier 30 receives two differential signals 80, 81, and outputs a single value. The output of amplifier 30 is coupled to the input of buffer 33. Buffer 33 drives the value at its input out onto I/O 21. Depending on the implementation, I/O 21 can be sent out to a data pad or a register or a multiplexor. For this example, the flash part is an x16 device, so 16 data bits are sent out from the chip to the external world even though 64 bits can be sensed during a read operation. Thus the output signals from the post-sense amp 20 are coupled to a muliplexor that outputs a set of selected data bits.

Traditionally, circuits that operate with full rail to rail supplies from a ground potential to Vcc, such as CMOS, transmission gates comprising of both an N-type device and a P-type device were necessary. The transmission gate would allow for the passage of a signal that could swing from rail to rail.

However, the post-sense amp 30 of this embodiment uses pass gates. The ability to use pass gate logic in this instance comes from the use of differential signals. Because the signal values from the pre-sense amp swing within a small range and the two differential signals differ a small amount from each other, pass gates are sufficient to transfer the signals. The ability to use pass gate logic can be advantageous in providing both power savings and reducing die size. A pass gate can be one single transistor device where as a transmission gate generally consists of two transistors. Furthermore, the activation of one transistor instead of two reduces power consumption. The loading on the sense amp providing the differential signals can be smaller also. The capacitance that has to be charged up when the signals transition is reduced due to the use of the pass gate. Such savings become noticeable in a large capacity memory since the sense amps are repeatedly activated during each memory read operation. The smaller load on the drivers and the lower capacitance also allows for faster speed in the sensing and reading of data. However, an alternative embodiment of the post sense amp 30 can use transmission gates instead of pass gates.

Amplifier 30 is enabled with ENABLE POST#. In addition to the ENABLE POST# signal, a number of other signals are also coupled to this embodiment of the post-sense amp 20. SLSOUT 19 and SLSOUT# 18 are the complementary differential signals outputted from the pre-sense amp 15. Similarly, three additional complementary pairs of differential signals, RSA0 61/RSA0# 65, RSA1 62/RSA1# 66, and RSA2 63/RSA2# 67, are sent into the post-sense amp 20. These three pairs of signals are from the redundancy circuitry. The redundant signals are also coupled to the other post-sense amps in the memory device.

In flash memory, as with other type of integrated circuit memories, certain defects may occur within the memory array. Such a defect may cause the entire die on which the defect exists to be unsuitable for normal use or shipment to a customer. One method of curing defects in a memory array is to include redundant elements into the array. The redundant elements can be activated to replace the memory elements affected by a defect. For this embodiment, additional columns called redundant columns are included. Thus, if a certain main memory column has a manufacturing defect, the redundancy logic can be enabled to replace that defective column with a redundant column. But as far as a user is concerned, the memory will behave like a normal part. Similarly, additional rows such as redundant rows can also be added to the array.

For this embodiment, three redundant columns are available. Each post-sense amp 20 receives the value of a corresponding redundant cell. The pairs of differential signals are each coupled to pass gates. SLSOUT 19 is coupled to the drain terminal of N-type pass gate N1 70. SLSOUT# 18 is coupled to the drain terminal of N-type pass gate N5 74. The RSA0 61 signal from redundant sense amp 0 is coupled to the drain terminal of N-type pass gate N2 71. The other differential signal RSA0# 65 from redundant sense amp 0 is coupled to the drain terminal of N-type pass gate N6 75. The RSA1 62 signal from redundant sense amp 1 is coupled to the drain terminal of N-type pass gate N3 72. The other differential signal RSA1# 66 from redundant sense amp 1 is coupled to the drain terminal of N-type pass gate N7 76. The RSA2 63 signal from redundant sense amp 3 is coupled to the drain terminal of N-type pass gate N4 73. The other differential signal RSA2# 63 from redundant sense amp 2 is coupled to the drain terminal of N-type pass gate N8 77.

Each of the gate terminals of the pass gates N1 70, N2 71, N3 72, N4 73, N5 74, N6 75, N7 76, N8 77, are coupled to control signals from control logic. The redundancy matching determines whether the redundancy is being used or not. The control logic ensures that one corresponding pair of pass gates are active at a given instance. The logic checks that two different outputs will not use the same redundant input. Thus if the value from the main sense amps is to be read out, N1 70 and N5 74 are enabled to pass SLSOUT 19 and SLSOUT# 18 through to amplifier 30. Similarly, if the value from the redundant sense amps 0 is to be read out, N2 71 and N6 75 are enabled to pass RSA0 61 and RSA0# 65 through to amplifier 30. If the value from the redundant sense amps 1 is to be read out, N3 72 and N7 76 are enabled to pass RSA1 62 and RSA1# 66 through to amplifier 30. If the value from the redundant sense amps 0 is to be read out, N4 73 and N8 77 are enabled to pass RSA2 63 and RSA2# 67 through to amplifier 30.

After the desired data value is transferred across the relevant pass gate, the control logic of one embodiment turns off the pass gate, thus latching the value between the pass gate and the input of the amplifier 30. The amplifier 30 can continue evaluating the value without the data value continually driven from the main or redundant sense amps. For one embodiment, the signals from redundant sense amps are gated through another set of pass gates in post sense amp 20. These additional pass gates disconnect the redundant signals to the output lines when turned off. Thus the RSA0 61, RSA1 62, RSA2 63, RSA0# 65, RSA1# 66, RSA2# 67 signals coupled to N2 71, N3 72, N4 73, N6 75, N7 76, N8 77 in the alternative embodiment are static during a read.

Generally, the amplifier 30 senses the values from the main sense amp. The redundant values are sensed with a redundant element is used to replace the regular main memory cell. Because the redundant values are also coupled to all of the other post-sense amps, a redundant element can be valid for only one post-sense amp at a given read operation.

Figure 5:
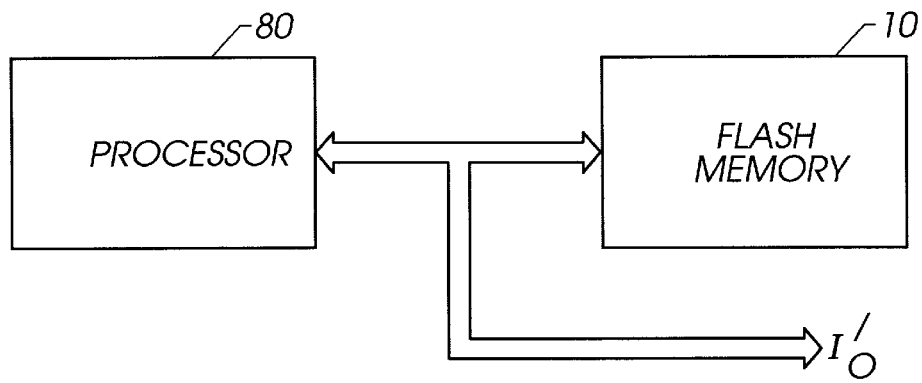
FIG. 5 is a block schematic diagram showing one system utilization for the flash memory device incorporating the present invention.

Referring to FIG. 5, it is appreciated that the flash memory device 10 of the present invention can be utilized in a variety of different capacities. One system is shown in FIG. 5 in which the flash memory device 10 is coupled on a bus to a processor 50. The processor controls the operation of the flash memory 10 as well as utilizing the data present in the flash memory 10. In general application, the processor along with the flash memory is coupled to other devices (here shown as I/O, input/output) to exemplify a system in which a processor 50 and flash memory 10 are utilized. A variety of other configurations and systems can be devised in order to utilize the flash memory device 10 incorporating the present invention.

System 500 is representative of processing systems based on the PENTIUM® III, PENTIUM® 4, Itanium® microprocessors available from Intel Corporation of Santa Clara, Calif., although other systems (including PCs having other microprocessors, engineering workstations, set-top boxes and the like) may also be used. In one embodiment, sample system 500 may be executing a version of the WINDOWS® operating system available from Microsoft Corporation of Redmond, Wash., although other operating systems and graphical user interfaces, for example, may also be used. Thus, the present invention is not limited to any specific combination of hardware circuitry and software.

Figure 6:
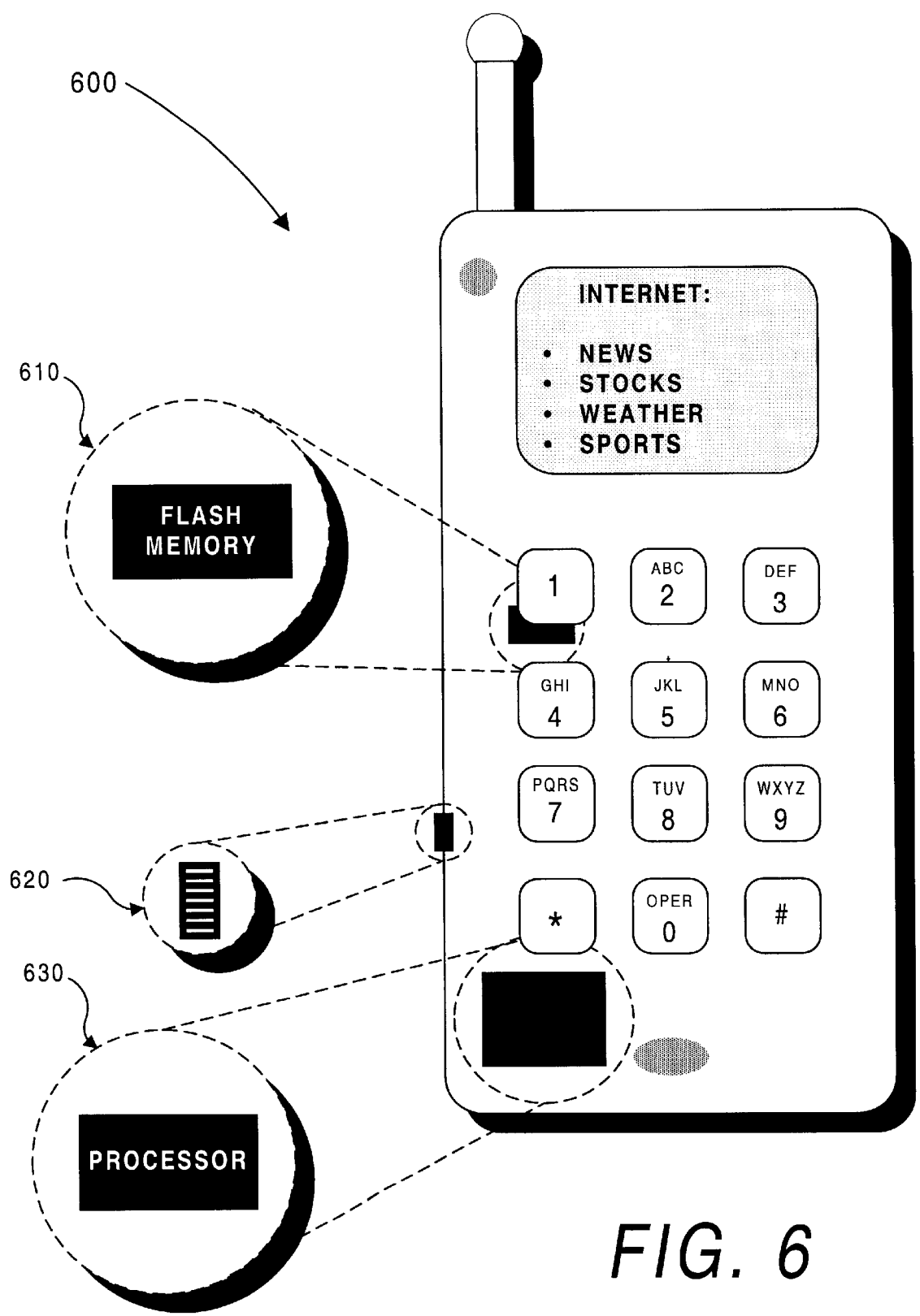
FIG. 6 illustrates one embodiment of a cellular telephone using a flash memory device.

Referring now to FIG. 6, there is an example of a cellular telephone 600 using a flash memory device 610. The cellular telephone 600 shown in FIG. 6 is a digital phone capable of internet access. For example, a user can download and receive information from the Internet via cellular access. This cellular phone 600 can be a Personal Communications Service (PCS) phone using digital cellular technology such as Code-Division Multiple Access (CDMA), Time Division Multiple Access (TMDA), or Global System for Mobile (GSM) Communications. Similarly, flash memory can also be used in analog type cellular phones. Thus, the present invention is not limited to any specific combination of hardware circuitry and software.

Flash memory 610 and a processor 630 are located within cellular phone 600. Flash memory 610 has been designed to include a fast program mode. Processor 630 can be an embedded processor or a digital signal processing (DSP) chip. The phone 600 of FIG. 6 also includes an access port 620. Access port 620 can be used to physically link the phone 600 to an external system for code and/or data update. For instance, the flash memory can be updated through the access port interface or through a download via cellular transmission.

A memory update via the access port 620 is an example of an in-system write. In-system write utilizes the system processor 630 to execute flash memory erase and program algorithms. An engineer creates erase, program and verify algorithms and then downloads these algorithms into the system random access memory (RAM). The processor 630 executes the algorithms and ports code to the flash memory 610 for updates. In-system write is also a way to perform PC BIOS code updates.

The present invention is not limited to computer systems or cellular phones. Alternative embodiments of the present invention can be used in other types of devices such as handheld devices and embedded applications. Some examples of handheld devices include Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system that uses flash memory for other embodiments. Flash memory is also used in personal computers (PC) and other computer systems.

For another embodiment of a system, one implementation of a memory including a differential redundancy multiplexor mechanism can be used with a system on a chip. One embodiment of a system on a chip comprises of a processor and a memory. The memory for one system is a flash memory. The flash memory can be located on the same die as the processor and other system components. Additionally, other logic blocks such as a memory controller or graphics controller can also be located on a system on a chip. By including one embodiment of the present invention on the system on a chip, the flash memory can be updated quickly and with minimal inconvenience to a user.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. An apparatus comprising:
   a memory array comprising a main memory element and a redundant element;
   a sense amp coupled to said memory array, said sense amp to evaluate said main memory element and to generate a first pair of differential output signals;
   a redundant sense amp coupled to said memory array, said redundant sense amp to evaluate said redundant memory element and to generate a second pair of differential output signals;

a multiplexor coupled to said sense amp and said redundant sense amp, said multiplexor to receive said first pair of differential output signals and said second pair of differential output signals, said multiplexor to generate a single ended output from evaluating a single pair of differential output signals; and control logic coupled to said multiplexor to control whether said first pair of differential output signals or said second pair of differential output signals is said single pair of differential output signals evaluated.

2. The apparatus of claim 1 wherein said main memory element and said redundant memory element are flash cells.

3. The apparatus of claim 2 wherein voltage levels of said first pair of differential output signals depend on a threshold voltage of said main memory element.

4. The apparatus of claim 3 wherein voltage levels of said second pair of differential output signals depend on a threshold voltage level of said redundant memory element.

5. The apparatus of claim 1 wherein said multiplexor further comprises pass gate logic wherein a first pair of pass gates are coupled to said first pair of differential signals and a second pair of pass gate are coupled to said second pair of differential signals.

6. The apparatus of claim 1 wherein said multiplexor further comprises a comparator to evaluate a pair of differential signals and to provide a single-ended output.

7. The apparatus of claim 5 wherein said control logic selectively enables and disables said first pair of pass gate to select and deselect said first pair of differential signals for evaluation.

8. The apparatus of claim 7 wherein said control logic selectively enables and disables said second pair of pass gates to select and deselect said second pair of differential signals for evaluation.

9. The apparatus of claim 1 wherein said apparatus is a flash memory device.

10. An apparatus comprising:
a processor coupled to a bus; and
a memory coupled to said bus, said memory comprising:
a memory array comprising a main memory element and a redundant element;
a sense amp coupled to said memory array, said sense amp to evaluate said main memory element and to generate a first pair of differential output signals;
a redundant sense amp coupled to said memory array, said redundant sense amp to evaluate said redundant memory element and to generate a second pair of differential output signals; and
a multiplexor coupled to said sense amp and said redundant sense amp, said multiplexor to receive said first pair of differential output signals and said second pair of differential output signals, said multiplexor to generate a single ended output from evaluating a single pair of differential output signals.

11. The apparatus of claim 10 further comprising control logic coupled to said multiplexor to control whether said first pair of differential output signals or said second pair of differential output signals is said single pair of differential output signals evaluated.

12. The apparatus of claim 11 wherein voltage levels of said first pair of differential output signals depend on a threshold voltage of said main memory element.

13. The apparatus of claim 12 wherein voltage levels of said second pair of differential output signals depend on a threshold voltage level of said redundant memory element.

14. The apparatus of claim 13 wherein said multiplexor further comprises pass gate logic wherein a first pair of pass gates are coupled to said first pair of differential signals and a second pair of pass gate are coupled to said second pair of differential signals.

15. The apparatus of claim 14 wherein said multiplexor further comprises a comparator to evaluate a pair of differential signals and to provide a single-ended output.

16. The apparatus of claim 15 wherein said control logic selectively enables and disables said first pair of pass gate to select and deselect said first pair of differential signals for evaluation.

17. The apparatus of claim 16 wherein said control logic selectively enables and disables said second pair of pass gates to select and deselect said second pair of differential signals for evaluation.

18. The apparatus of claim 10 wherein said multiplexor is a differential redundancy multiplexor.

19. The apparatus of claim 10 wherein said memory is a flash memory device.

20. A method comprising:
sensing a first memory element and generating a first pair of differential signals based on a state of said first memory element;
sensing a redundant memory element and generating a second pair of differential signals based on a state of said second memory element;
multiplexing said first pair and said second pair of differential signals;
selecting a single pair of differential signals from either said first pair or said second pair of differential signals for evaluation;
evaluating said single pair of differential signals; and
generating a single-ended output signal.

21. The method of claim 20 wherein said multiplexing comprises the coupling of said first pair of differential signals to a first pair of pass gates.

22. The method of claim 21 wherein said multiplexing comprises the coupling of said second pair of differential signals to a second pair of pass gates.

23. The method of claim 22 wherein said selecting comprises enabling either said first pair of pass gates or said second pair of pass gates to propagate either said first pair of differential signals or said second pair of differential signals.

24. The method of claim 23 wherein said evaluating comprises determining whether a marginal voltage difference between a first and second differential signal in said single pair of differential signals indicates a logical one or zero.

25. The method of claim 20 wherein said multiplexing comprises the coupling of said first pair of differential signals to a first pair of transmission gates.

26. The method of claim 25 wherein said multiplexing comprises the coupling of said second pair of differential signals to a second pair of transmission gates.

27. The method of claim 26 wherein said selecting comprises enabling either said first pair of transmission gates or said second pair of transmission gates to propagate either said first pair of differential signals or said second pair of differential signals.

28. The method of claim 27 wherein said evaluating comprises determining whether a marginal voltage difference between a first and second differential signal in said single pair of differential signals indicates a logical one or zero.

* * * * *

UNITED STATES PATENT AND TRADEMARK OFFICE
CERTIFICATE OF CORRECTION

PATENT NO.     : 6,574,141 B2
DATED          : June 3, 2003
INVENTOR(S)    : Baltar It is certified that error appears in the above-identified patent and that said Letters Patent is hereby corrected as shown below:

<u>Column 4,</u>
Line 21, after "pre-sensing amplifier", insert -- 15 --.

Signed and Sealed this

Second Day of December, 2003

JAMES E. ROGAN
*Director of the United States Patent and Trademark Office*